United States Patent
Kwak

(10) Patent No.: US 11,423,954 B2
(45) Date of Patent: Aug. 23, 2022

(54) SEMICONDUCTOR MEMORY DEVICE CAPABLE OF SUPPORTING ASYNCHRONOUS POWER-DOWN MODE, AND OPERATING METHOD THEREOF

(71) Applicant: SK hynix Inc., Gyeonggi-do (KR)

(72) Inventor: Noh Hyup Kwak, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/189,501

(22) Filed: Mar. 2, 2021

(65) Prior Publication Data

US 2022/0130433 A1    Apr. 28, 2022

(30) Foreign Application Priority Data

Oct. 27, 2020  (KR) .................. 10-2020-0140154

(51) Int. Cl.
*G11C 5/14*          (2006.01)
(52) U.S. Cl.
CPC ................... *G11C 5/148* (2013.01)
(58) Field of Classification Search
CPC .................................................. G11C 5/148
See application file for complete search history.

(56) References Cited

U.S. PATENT DOCUMENTS

| | | | |
|---|---|---|---|
| 6,845,055 B1* | 1/2005 | Koga | G11C 7/1072 365/228 |
| 9,733,949 B2* | 8/2017 | Song | G06F 9/4403 |
| 2003/0039151 A1* | 2/2003 | Matsui | G11C 7/1051 365/195 |
| 2017/0104406 A1* | 4/2017 | Kim | H01L 25/0657 |
| 2021/0075430 A1* | 3/2021 | Han | H03L 7/0814 |
| 2021/0143807 A1* | 5/2021 | Kim | H03L 7/0893 |

FOREIGN PATENT DOCUMENTS

KR     10-0311115      12/2001

* cited by examiner

*Primary Examiner* — Khamdan N. Alrobaie
(74) *Attorney, Agent, or Firm* — IP & T Group LLP

(57) ABSTRACT

According to an embodiment of the present disclosure, a semiconductor memory device includes a first buffer circuit suitable for receiving a command/address signal to output a first buffered signal according to a first control signal; a first setup/hold circuit suitable for delaying the first buffered signal to output an internal command/address signal according to a second control signal; a command decoder suitable for generating a plurality of internal signals by decoding the internal command/address signal according to a third control signal and an internal dock signal; and a timing controller suitable for delaying a dock enable signal to generate the first to third control signals, and controlling the first to third control signals to be deactivated in a first sequence when entering a power-down mode, and to be activated in a second sequence different from is the first sequence when exiting the power-down mode.

29 Claims, 2 Drawing Sheets

SEMICONDUCTOR MEMORY DEVICE CAPABLE OF SUPPORTING ASYNCHRONOUS POWER-DOWN MODE, AND OPERATING METHOD THEREOF

CROSS-REFERENCE TO RELATED APPLICATION

The present application claims priority of Korean Patent Application No. 10-2020-0140154, filed on Oct. 27, 2020, which is herein incorporated by reference in its entirety.

BACKGROUND

1. Field

The disclosure relates to semiconductor design technology, and specifically to, a semiconductor device capable of supporting an asynchronous power-down mode.

2. Description of the Related Art

Recently, a semiconductor device may have a power-down mode in order to reduce the amount of current consumed, because the semiconductor device may have a period where no operation is performed. For example, a memory device may enter a power-down mode during the period when no data is inputted and outputted, where it does not perform operations on memory blocks except for a specific internal block.

Moreover, a memory device among the semiconductor devices performs an entry/exit operation into/from a power-down mode using a clock enable signal. Such a memory device receives the clock enable signal provided form the outside, and generates a plurality of internal signals for controlling internal circuits (e.g., buffers) by synchronizing the clock enable signal with an internal clock signal, thereby performing the entry/exit operation into/from the power-down mode. That is, it is possible to prevent the generation of abnormal glitches that may occur on the internal signals by synchronizing the asynchronously inputted clock enable signal with the internal clock signal.

However, this requires the internal clock signal to be toggled at all times, which results in greater current consumption. In addition, when changing a clock buffer due to a change between a high-speed operation and a low-speed operation, the buffer change operation is performed before the clock enable signal reaches a logic low level, is while a frequency change operation is performed after the clock enable signal enters the power-down mode, during the power-down mode. At this time, the clock buffer may act as a buffer that is not suitable for the operating frequency during the interval before the frequency change operation occurs after the buffer change operation. For example, the clock buffer may act as a low-speed buffer in the high-speed operation, or act as a high-speed buffer in the low-speed operation. Accordingly, the clock buffer may not generate the normal internal clock signal, and thus the internal signals generated by synchronizing the internal clock signal during the entry exit operation into/from the power down mode are also abnormally generated, which is likely to cause malfunction of the memory device.

SUMMARY

According to various embodiments of the present disclosure, there are provided a semiconductor memory device capable of generating internal signals for an entry/exit operation into/from a power down mode by asynchronously controlling a clock enable signal that is inputted from the outside, without synchronizing to an internal dock signal, and an operating method thereof.

According to an embodiment of the present disclosure, a semiconductor memory device includes a first buffer circuit suitable for receiving a command/address signal to output a first buffered signal, according to a first control signal; a first setup/hold circuit suitable for delaying the first buffered signal to output an internal command/address signal according to a second control signal; a command decoder suitable for generating a plurality of internal signals by decoding the internal command/address signal according to a third control signal and an internal clock signal; and a timing controller suitable for delaying a clock enable signal to generate the first to third control signals, and controlling the first to third control signals to be deactivated in a first sequence when entering a power-down mode, and to be activated in a second sequence different from the first sequence when exiting the power-down mode.

According to an embodiment of the present disclosure, an operating method of a semiconductor memory device includes delaying a dock enable signal to generate first to third control signals; receiving a command/address signal to output a first buffered signal according to the first control signal; delaying the first buffered signal by a target setup/hold time to output an internal command/address signal according to the second control signal; generating a plurality of internal signals by decoding the internal command/address signal according to the third control signal and an internal clock signal; and controlling the first to third control signals to be deactivated in a first sequence when entering a power-down mode, and to be activated in a second sequence different from the first sequence when exiting the power-down mode.

According to an embodiment of the present disclosure, a is semiconductor memory device includes a first circuit operable according to a first control signal; a second circuit operable according to a second control signal; a third circuit operable according to a third control signal; and a control circuit suitable for disabling the first to third control signals in a first sequence and enabling the first to third control signals in a second sequence, in asynchronization with an internal clock signal generated within the semiconductor memory device.

According to the embodiments of the present disclosure, the semiconductor memory device may reduce the current consumption due to the toggling of the internal dock signal by controlling the entry/exit operation into/from the power-down mode in an asynchronous manner that is not synchronized to the internal clock signal.

According to the embodiments of the present disclosure, the semiconductor memory device may prevent malfunction by asynchronously controlling the entry/exit operation into/from the power-down mode by preventing abnormal generation of the internal signals when changing between a high-speed operation and a low-speed operation.

DETAILED DESCRIPTION

Figure 1:
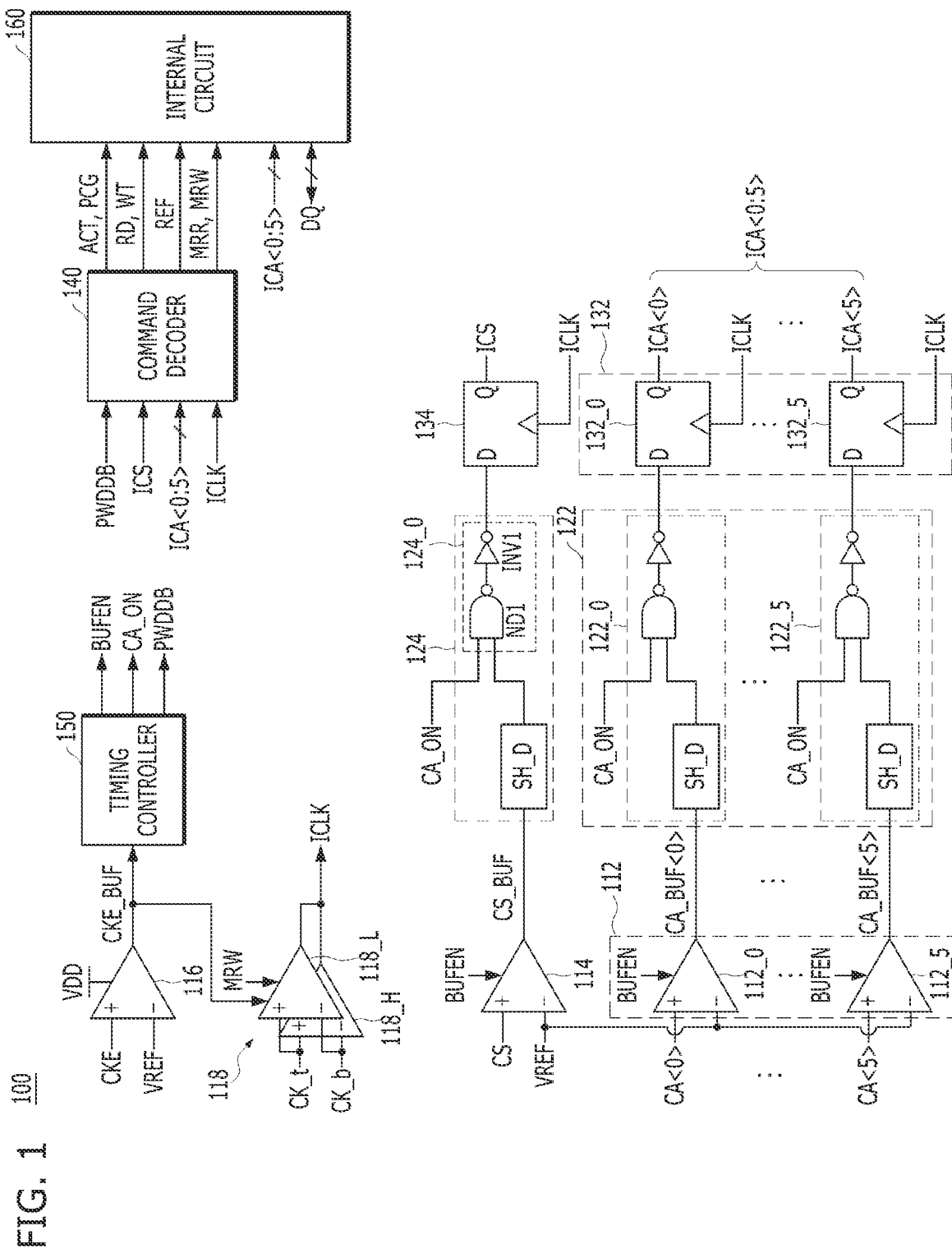
FIG. 1 is a block diagram illustrating a semiconductor memory device according to an embodiment of the present invention.

Various embodiments of the present disclosure are described below with reference to the accompanying drawings. The embodiments may, however, be embodied in different forms and thus should not be construed as limited to the embodiments set forth herein. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could also be termed a second or third element in another instance without indicating any change in the element itself.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other dements. As used herein, the term "and/or" includes any and all combinations of one or more of the associated listed items.

FIG. 1 is a block diagram illustrating a semiconductor memory device 100 according to an embodiment of the present invention.

Referring to FIG. 1, the semiconductor memory device 100 may include a first buffer circuit 112, a second buffer circuit 114, a third buffer circuit 116, a fourth buffer circuit 118, a first setup/hold circuit 122, a second setup/hold circuit 124, a first synchronization is circuit 132, a second synchronization circuit 134, a command decoder 140, a timing controller 150, and an internal circuit 160.

The first buffer circuit 112 may receive a command/address signal CA<0:5> to output a first buffered signal CA_BUF<0:5>, according to a first control signal BUFEN. The first buffer circuit 112 may have a plurality of buffer circuits that respectively correspond to bits in the command/address signal CA<0:5>. For example, when the command/address signal CA<0:5> is composed of 6 bits, 6 buffer circuits 112_0 to 112_5 may be provided. Each of the first buffer circuits 112_0 to 112_5 may be implemented with a differential amplifier that receives the corresponding bit of the command/address signal CA <0:5> through a first input terminal (+), and a reference voltage VREF through a second input terminal (−).

The second buffer circuit 114 may receive a chip select signal CS to output a second buffered signal CS_BUF, according to the first control signal BUFEN. The second buffer circuit 114 may be implemented with a differential amplifier that receives the chip select signal CS through a first input terminal (+), and the reference voltage VREF through a second input terminal (−).

The third buffer circuit 116 may receive a clock enable signal CKE based on the reference voltage VREF to output a third buffered signal CKE_BUF. The third buffer circuit 116 may be implemented with a differential amplifier that receives the clock enable signal CKE through a first input terminal (+), and the reference voltage VREF is through a second input terminal (−). For reference, the reference voltage VREF provided to the first to third buffer circuits 116 may have the same voltage level, or different voltage levels from each other.

The fourth buffer circuit 118 may receive differential clock signals CK_t and CK_b, which are inputted from the outside, to output an internal clock signal ICLK, according to the third buffered signal CKE_BUF. According to an embodiment, the fourth buffer circuit 118 may receive a single-ended dock signal instead of the differential dock signals CK_t and CK_b. According to an embodiment, an internal clock generation circuit may be provided to generate the internal dock signal ICLK based on an output of the fourth buffer circuit 118. The internal clock generation circuit may be composed of a delay locked loop (DLL) or a phase locked loop (PLL).

The first setup/hold circuit 122 may delay the first buffered signal CA_BUF<0:5> to output an internal command/address signal ICA<0:5>, according to a second control signal CA_ON. The first setup/hold circuit 122 may have a plurality of buffer circuits that respectively correspond to bits in the command/address signal CA<0:5>. The first setup/hold circuit 122 may have a plurality of setup/hold circuits that respectively correspond to the bits in the command/address signal CA<0:5>, For example, when the command/address signal CA<0:5> is composed of 6 bits, 6 setup/hold circuits 122_0 to 122_5 may be provided.

The second setup/hold circuit 124 may delay the second buffered signal CS_BUF to output an internal chip select signal ICS, according to the second control signal CA_ON.

Each of the setup/hold circuits 122_0 to 122_5 within the first setup/hold circuit 122 may have substantially the same configuration as the second setup/hold circuit 124, and thus the second setup/hold circuit 124 will be described. The second setup/hold circuit 124 may include a delay compensator SH_D and an output controller 124_0.

The delay compensator SH_D may delay the second buffered signal CS_BUF by a delay amount corresponding to a target setup/hold time. The output controller 124_0 may output an output of the delay compensator SH_D as the internal chip select signal ICS according to the second control signal CA_ON. The output controller 124_0 may output the output of the delay compensator SH_D as the internal chip select signal ICS when the second control signal CA_ON is activated, and mask the output of the delay compensator SH_D and output the internal chip select signal ICS having a logic low level when the second control signal CA_ON is deactivated. The second control signal CA_ON may be activated during a normal mode, and deactivated to mask outputting of the internal chip select signal ICS during a power-down mode. The output controller 124_0 may be composed of a logic NAND gate ND1 and an inverter INV1, to perform a logic AND operation on the output of the delay compensator SH_D and the second control signal CA_ON to output the internal chip select signal ICS.

The first synchronization circuit 132 may output the internal command/address signal ICA<0:5> by synchronizing to the internal clock signal ICLK. The first synchronization circuit 132 may have a plurality of synchronization circuits that respectively correspond to the bits in the command/address signal CA<0:5>. For example, when the command/address signal CA<0:5> is composed of 6 bits, 6 synchronization circuits 132_0 to 132_5 may be provided.

The second synchronization circuit 134 may output the internal chip select signal ICS by synchronizing to the internal clock signal ICLK.

The command decoder 140 may generate a plurality of internal signals by decoding the internal command/address signal ICA<0:5> and the internal chip select signal ICS, according to a third control signal PWDDB and the internal clock signal ICLK. The internal signals may include an active signal ACT, a pre-charge signal PCG, a read signal RD, a write signal WT, a refresh signal REF, a first mode register (MR) signal MRR, and a second MR signal MRW. The command decoder 140 may generate the internal signals by decoding the internal command/address signal ICA<0:5> and the internal chip select signal ICS, in synchronization with the internal clock signal ICLK, during the normal mode. The command decoder 140 may deactivate or initialize the internal signals according to the third control signal PWDDB, during the power-down mode.

The internal circuit 160 may operate in response to the internal signals. In case of the semiconductor memory device, the internal circuit 160 may include a plurality of memory cells (not shown) and peripheral circuits (not shown) for accessing the memory cells. The internal circuit 160 may perform a normal operation such as a read or write operation, during the normal mode. For example, the internal circuit 160 may store write data DQ into memory cells assigned by an address among the internal command/address signal ICA<0:5>, in response to the internal signals during the write operation. The internal circuit 160 may output read data DQ from memory cells assigned by an address among the internal command/address signal ICA<0:5>, in response to the internal signals during the read operation. The internal circuit 160 may control any other peripheral circuits not to operate, except for particular peripheral circuits, in response to the internal signals during the power-down mode.

In an embodiment, the fourth buffer circuit 118 may include a first operational dock buffer 118_L and a second operational clock buffer 118_H. When the third buffered signal CKE_BUF is activated, the first operational dock buffer 118_L may buffer the differential dock signals CK_t and CK_b to output the internal dock signal ICLK having a first frequency, in response to at least one signal (e.g., the second MR signal MRW) selected from the internal signals. The second operational dock buffer 118H may operate mutually exclusive is from the first operational dock buffer 118_L. When the third buffered signal CKE_BUF is activated, the second operational dock buffer 118_H may buffer the differential dock signals CK_t and CK_b to output the internal dock signal ICLK having a second frequency higher than the first frequency, in response to the second MR signal MRW. That is, during a section in which the dock enable signal CKE is a logic high level, the fourth buffer circuit 118 may generate the internal dock signal ICLK which has any of a high frequency and a low frequency according to a value of the second MR signal MRW.

The timing controller 150 may delay the clock enable signal CKE to generate the first to third control signals BUFEN, CA_ON, and PWDDB. In particular, since the timing controller 150 does not receive the internal dock signal ICLK, the timing controller 150 may output the first to third control signals BUFEN, CA_ON, and PWDDB by asynchronously delaying the dock enable signal CKE regardless of the internal dock signal ICLK. The timing controller 150 may control the first to third control signals BUFEN, CA_ON, and PWDDB to be deactivated in a first sequence, when entering the power-down mode. The timing controller 150 may control the first to third control signals BUFEN, CA_ON, and PWDDB to be activated in a second sequence different from the first sequence, when exiting the power-down mode. For example, when entering the power-down mode, the timing controller 150 may sequentially deactivate the third control signal PWDDB, the second control signal CA_ON and the first control signal is BUFEN, according to the first sequence. When exiting the power-down mode, the timing controller 150 may sequentially activate the third control signal PWDDB, the first control signal BUFEN and the second control signal CA_ON, according to the second sequence.

For reference, the first control signal BUFEN may be used as a buffer enable signal for controlling the first and second buffer circuits 112 and 114 receiving the command/address signal CA<0:5> and the chip select signal CS. That is, during the power-down mode, the first control signal BUFEN is deactivated to a logic low level, so that the first and second buffer circuits 112 and 114 are disabled. The second control signal CA_ON may be used as an output control signal for masking output signals from the first and second setup/hold circuits 122 and 124. That is, during the power-down mode, the second control signal CA_ON is deactivated to a logic low level, to output the internal command/address signal ICA<0:5> and the internal chip select signal ICS to be fixed to a logic low level. The third control signal PWDDB may be used as a power-down signal for setting the power-down mode of the internal circuit 160. That is, during the power-down mode, the third control signal PWDDB is deactivated to a logic low level, so that the command decoder 140 deactivates the internal signals to set the internal circuit 160 to operate in the power-down mode.

Figure 2:
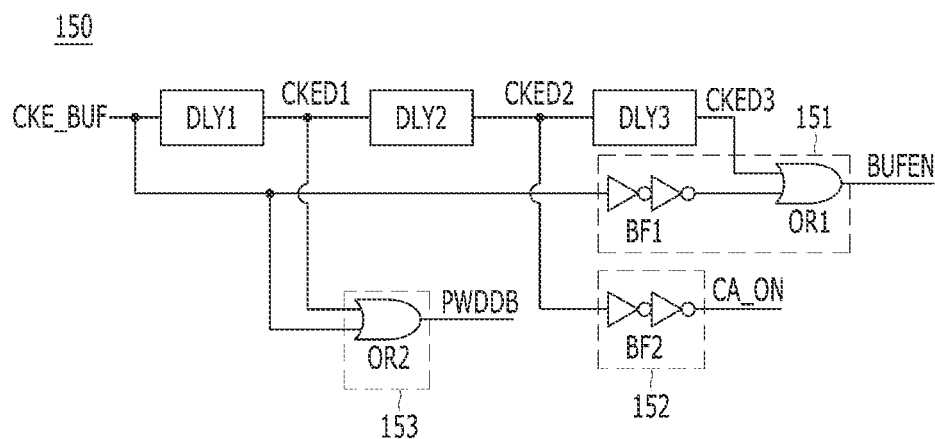
FIG. 2 is a circuit diagram illustrating a timing controller of FIG. 1.

FIG. 2 is a circuit diagram illustrating the timing controller 150 of FIG. 1.

Referring to FIG. 2, the timing controller 150 may include a first delay circuit DLY1, a second delay circuit DLY2, a third delay circuit DLY3, a first logic circuit 151, a second logic circuit 152, and a third logic circuit 153.

The first delay circuit DLY1 may delay the third buffered signal CKE_BUF by a first delay amount to output a first delay signal CKED1. The second delay circuit DLY2 may delay the first delay signal CKED1 by a second delay amount to output a second delay signal CKED2. The third delay circuit DLY3 may delay the second delay signal CKED2 by a third delay amount to output a third delay signal CKED3. For example, the first to third delay amounts may be substantially the same. However, the present invention is not limited to this, and one or more delay amounts may be controlled to have a different delay time.

The first logic circuit 151 may output the first control signal BUFEN according to the third buffered signal CKE_BUF and the third delay signal CKED3. For example, the first logic circuit 151 may include a first buffer BF1 for buffering the third buffered signal CKE_BUF, and a first logic gate OR1 for performing a logic OR operation on an output of the first buffer BF1 and the third delay signal CKED3. In an embodiment, the first buffer BF1 may include an even-number (e.g., 2) of inverters coupled in series, and the first logic gate OR1 may be composed of a logic OR gate. At this time, a delay time occurred by the first buffer BF1 may be smaller than the first to third delay amounts. As described above, the first logic circuit 151 may output the first control signal BUFEN which is deactivated to a logic low level when the third delay signal CKED3 is deactivated, and activated to a logic high level after the third buffered signal CKE_BUF is activated.

The second logic circuit 152 may output the second control signal CA_ON by buffering the second delay signal CKED2. The second logic circuit 152 may include an even-number (e.g., 2) of inverters coupled in series. As described above, the second logic circuit 152 may output the second control signal CA_ON which is deactivated to a logic low level after the second delay signal CKED2 is deactivated, and activated to a logic high level after the second delay signal CKED2 is activated.

The third logic circuit 153 may output the third control signal PWDDB according to the third buffered signal CKE_BUF and the first delay signal CKED1. For example, the third logic circuit 153 may include a second logic gate OR2 for performing a logic OR operation on the third buffered signal CKE_BUF and the first delay signal CKED1. In an embodiment, the second logic gate OR2 may be composed of a logic OR gate. As described above, the third logic circuit 153 may output the third control signal PWDDB which is deactivated to a logic low level when the first delay signal CKED1 is deactivated, and activated to a logic high level when the third buffered signal CKE_BUF is activated.

Figure 3:
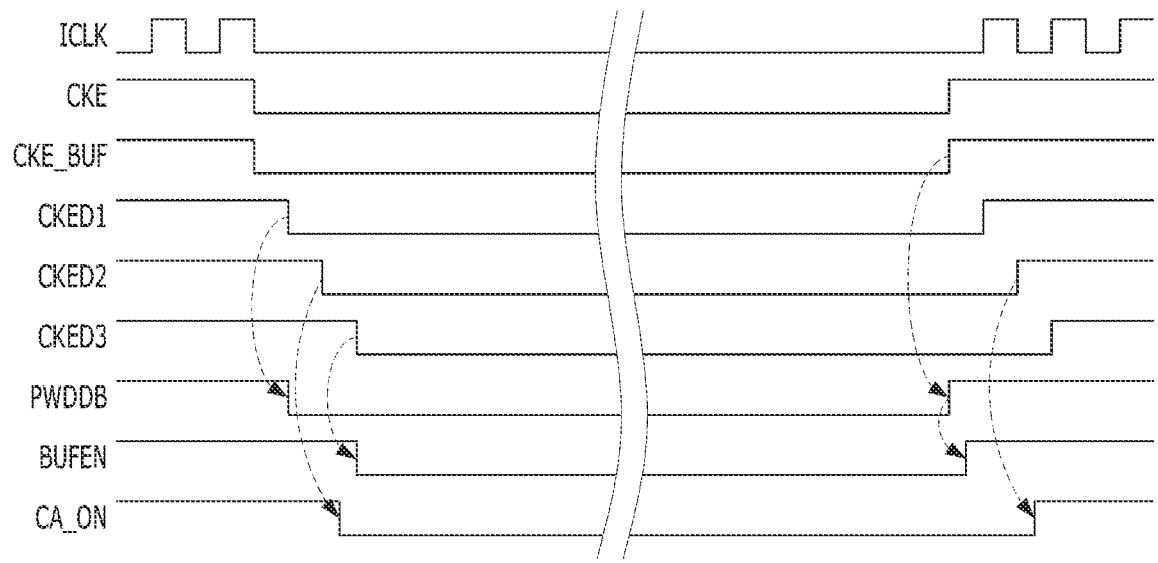
FIG. 3 is a waveform diagram for describing an operation of the timing controller of FIG. 2.

FIG. 3 is a waveform diagram for describing an operation of the timing controller 150 of FIG. 2.

Referring to FIG. 3, the first to third delay circuits DLY1 to DLY3 sequentially delay the third buffered signal CKE_BUF to output the first to third delay signals CKED1 to CKED3.

The third logic circuit 153 deactivates the third control signal PWDDB to a logic low level when the first delay signal CKED1 is deactivated. The second logic circuit 152 deactivates the second control signal CA_ON to a logic low level after a preset time from the deactivation of the second delay signal CKED2. The first logic circuit 151 deactivates the first control signal BUFEN to a logic low level when the third delay signal CKED3 is deactivated. As a result, when entering the power-down mode, the timing controller 150 may control the first to third control signals BUFEN, CA_ON, and PWDDB to be deactivated, according to the first sequence in which the third control signal PWDDB, the second control signal CA_ON, and the first control signal BUFEN are sequentially deactivated.

Thereafter, the third logic circuit 153 activates the third control signal PWDDB to a logic high level when the third buffered signal CKE_BUF is activated. The first logic circuit 151 activates the first control signal BUFEN to a logic high level after a preset time from the activation of the third buffered signal CKE_BUF. The second logic circuit 152 activates the second control signal CA_ON to a logic high level after a preset time from the activation of the second delay signal is CKED2. As a result, when exiting the power-down mode, the timing controller 150 may control the first to third control signals BUFEN, CA_ON, and PWDDB to be activated, according to the second sequence in which the third control signal PWDDB, the first control signal BUFEN, and the second control signal CA_ON are sequentially activated.

As described above, since the second control signal CA_ON is deactivated prior to the first control signal BUFEN when entering the power-down mode, the internal command/address signal ICA<0:5> and the internal chip select signal ICS may be masked before the first and second buffer circuits 112 and 114 are disabled. Accordingly, it is possible to prevent the generation of abnormal glitches which occur when the first and second buffer circuits 112 and 114 are disabled. Further, since the third control signal PWDDB is deactivated prior to the second control signal CA_ON, it is possible to prevent the generation of unintended internal signals by the command decoder 140) due to the internal command/address signal ICA<0:5> and the internal chip select signal ICS.

In addition, when exiting the power-down mode, the third control signal PWDDB is first activated to enable the command decoder 140. Thereafter, since the first control signal BUFEN is activated prior to the second control signal CA_ON, the generation of abnormal glitches which occur when the first and second buffer circuits 112 and 114 are enabled, may be masked by the second is control signal CA_ON.

As set forth above, according to the embodiments of the present disclosure, the memory device may reduce the current consumption due to the toggling of the internal clock signal by controlling the entry/exit operation into/from the power-down mode in an asynchronous manner that is not synchronized to the internal clock signal. According to the embodiments of the present disclosure, the semiconductor memory device may prevent malfunction by asynchronously controlling the entry/exit operation into/from the power-down mode, and by preventing abnormal generation of the internal signals when changing between a high-speed operation and a low-speed operation.

It should be noted that although the technical spirit of the disclosure has been described in connection with various embodiments thereof, this is merely for description purposes and should not be interpreted as limiting. It should be appreciated by one of ordinary skill in the art that various changes may be made thereto without departing from the technical spirit of the disclosure.

For example, different positions and types of the logic gates and transistors provided as examples in the above-described embodiments, may be implemented depending on the polarity of the input signal.

While the present teachings have been illustrated and described with respect to the specific embodiments, it will be apparent is to those skilled in the art in light of the present disclosure that various changes and modifications may be made without departing from the spirit and scope of the disclosure as defined in the following claims. What is claimed is:

What is claimed is:

1. A semiconductor memory device, comprising:
a first buffer circuit configured to receive a command/address signal to output a first buffered signal according to a first control signal;
a first setup/hold circuit configured to delay the first buffered signal to output an internal command/address signal according to a second control signal;
a command decoder configured to generate a plurality of internal signals by decoding the internal command/address signal according to a third control signal and an internal clock signal; and
a timing controller configured to delay a clock enable signal to generate the first to third control signals, and control the first to third control signals to be deactivated in a first sequence when entering a power-down mode, and to be activated in a second sequence different from the first sequence when exiting the power-down mode.

2. The semiconductor memory device of claim 1, wherein the timing controller does not receive the internal clock signal, and outputs the first to third control signals by asynchronously delaying the clock enable signal regardless of the internal clock signal.

3. The semiconductor memory device of claim 1, further comprising:
a second buffer circuit configured to receive a chip select signal to output a second buffered signal, according to the first control signal; and
a second setup/hold circuit configured to delay the second buffered signal to output an internal chip select signal according to the second control signal.

4. The semiconductor memory device of claim 3, wherein each of the first and second setup/hold circuits includes:
a delay compensator configured to delay a corresponding buffered signal of the first and second buffered signals by a delay amount corresponding to a target setup/hold time; and
an output controller suitable for outputting configured to output an output of the delay compensator as a corresponding one of the internal command/address signal and the internal chip select signal when the second control signal is activated, and mask the output of the delay compensator and fix the corresponding internal signal to a preset logic level when the second control signal is deactivated.

5. The semiconductor memory device of claim 3,
wherein the command decoder generates the internal signals by further decoding the internal chip select signal, in synchronization with the internal clock signal, during a normal mode, and
wherein the command decoder deactivates the internal signals according to the third control signal, during the power-down mode.

6. The semiconductor memory device of claim 1, further comprising an internal circuit configured to operate in response to the internal signals.

7. The semiconductor memory device of claim 1,
wherein the timing controller sequentially deactivates the third control signal, the second control signal, and the first control signal according to the first sequence, when entering the power-down mode, and
wherein the timing controller sequentially activates the third control signal, the first control signal, and the second control signal, according to the second sequence, when exiting the power-down mode.

8. The semiconductor memory device of claim 1, further comprising a third buffer circuit configured to receive the clock enable signal based on a reference voltage to output a third buffered signal.

9. The semiconductor memory device of claim 8, further comprising:
a first operational clock buffer configured to buffer an external clock signal to output the internal clock signal having a first frequency, in response to at least one selected from the internal signals, when the third buffered signal is activated; and
a second operational clock buffer configured to buffer the external clock signal to output the internal clock signal having a second frequency higher than the first frequency, in response to the selected internal signal, when the third buffered signal is activated.

10. The semiconductor memory device of claim 8,
wherein the timing controller receives the third buffered signal, and
wherein the timing controller includes:
a first delay circuit configured to delay the third buffered signal by a first delay amount to output a first delay signal;
a second delay circuit configured to delay the first delay signal by a second delay amount to output a second delay signal;
a third delay circuit configured to delay the second delay signal by a third delay amount to output a third delay signal;
a first logic circuit configured to output the first control signal according to the third buffered signal and the third delay signal;
a second logic circuit configured to output the second control signal by buffering the second delay signal; and
a third logic circuit configured to output the third control signal according to the third buffered signal and the first delay signal.

11. The semiconductor memory device of claim 10, wherein the first delay circuit includes:
a first buffer configured to buffer the third buffered signal; and
a first logic gate configured to perform a logic OR operation on an output of the first buffer and the third delay signal.

12. The semiconductor memory device of claim 10, wherein the second delay circuit includes a second logic gate configured to perform a logic OR operation on the third buffered signal and the first delay signal.

13. An operating method of a semiconductor memory device comprising:
delaying a clock enable signal to generate first to third control signals;
receiving a command/address signal to output a first buffered signal, according to the first control signal;
delaying the first buffered signal by a target setup/hold time to output an internal command/address signal, according to the second control signal;
generating a plurality of internal signals by decoding the internal command/address signal according to the third control signal and an internal clock signal; and
controlling the first to third control signals to be deactivated in a first sequence when entering a power-down mode, and to be activated in a second sequence different from the first sequence when exiting the power-down mode.

14. The operating method of claim 13, wherein the clock enable signal is asynchronously delayed regardless of the internal clock signal.

15. The operating method of claim 13, further comprising:
receiving a chip select signal to output a second buffered signal, according to the first control signal; and
delaying the second buffered signal by the target setup/hold time to output an internal chip select signal, according to the second control signal.

16. The operating method of claim 15,
wherein the internal signals are generated by further decoding the internal chip select signal, in synchronization with the internal clock signal, during a normal mode, and
further comprising deactivating the internal signals according to the third control signal, during the power-down mode.

17. The operating method of claim 13, further comprising:
buffering an external clock signal to output the internal clock signal having a first frequency or a second frequency higher than the first frequency, in response to at least one selected from the internal signals, when the clock enable signal is activated.

18. The operating method of claim 13, further comprising operating an internal circuit in response to the internal signals.

19. The operating method of claim 13,
wherein the third control signal, the second control signal, and the first control signal are controlled to be sequentially deactivated according to the first sequence, when entering the power-down mode, and
wherein the third control signal, the first control signal, and the second control signal are controlled to be sequentially activated, according to the second sequence, when exiting the power-down mode.

20. The operating method of claim 13, wherein the delaying of the clock enable signal includes:
receiving the clock enable signal based on a reference voltage to output a third buffered signal;
delaying the third buffered signal by a first delay amount to output a first delay signal;
delaying the first delay signal by a second delay amount to output a second delay signal;
delaying the second delay signal by a third delay amount to output a third delay signal;
outputting the first control signal according to the third buffered signal and the third delay signal;
outputting the second control signal by buffering the second delay signal; and
outputting the third control signal according to the third buffered signal and the first delay signal.

21. A semiconductor memory device comprising:
a first circuit operable according to a first control signal;
a second circuit operable according to a second control signal;
a third circuit operable according to a third control signal; and
a control circuit configured to disable the first to third control signals in a first sequence and enable the first to third control signals in a second sequence that is different from the first sequence, in asynchronization with an internal clock signal generated within the semiconductor memory device.

22. The semiconductor memory device of claim 21,
wherein the first circuit is configured to generate a first operational signal,
wherein the second circuit is configured to generate a second operational signal based on the first operational signal, and
wherein the third circuit is suitable configured to perform an operation based on the second operational signal.

23. The semiconductor memory device of claim 22, wherein the first sequence is in order of the third, second and first control signals.

24. The semiconductor memory device of claim 23, wherein the second sequence is in order of the third, first and second control signals.

25. The semiconductor memory device of claim 22, wherein the control circuit disables the control signals in the first sequence when the device enters a power-down mode.

26. The semiconductor memory device of claim 25, wherein the control circuit enables the control signals in the second sequence when the device exits the power-down mode.

27. The semiconductor memory device of claim 22, wherein the first circuit is a buffer circuit configured to generate a first buffered signal as the first operational signal according to a command/address signal.

28. The semiconductor memory device of claim 27, wherein the second circuit is a setup/hold circuit configured to delay the first buffered signal to generate an internal command/address signal as the second operational signal.

29. The semiconductor memory device of claim 28, wherein the third circuit is a command decoder configured to decode the internal command/address signal to generate a plurality of internal signals.

* * * * *